(12) United States Patent
Ishida et al.

(10) Patent No.: US 6,173,576 B1
(45) Date of Patent: Jan. 16, 2001

(54) COOLING UNIT FOR AN INTEGRATED CIRCUIT PACKAGE

(75) Inventors: Kenzo Ishida; Shuji Inoue, both of Ibaraki-ken (JP)

(73) Assignee: Intel Corporation, Santa Clara, CA (US)

(*) Notice: Under 35 U.S.C. 154(b), the term of this patent shall be extended for 0 days.

(21) Appl. No.: 09/276,254

(22) Filed: Mar. 25, 1999

(51) Int. Cl.[7] .............................. F25B 21/02; F25D 23/12
(52) U.S. Cl. ................................................. 62/3.7; 62/259.2
(58) Field of Search ........................ 62/3.2, 3.7, 259.2

(56) References Cited

U.S. PATENT DOCUMENTS

| | | | |
|---|---|---|---|
| 4,812,733 | * 3/1989 | Tobey | 323/285 |
| 5,398,041 | 3/1995 | Hyatt | 345/88 |
| 5,432,526 | 7/1995 | Hyatt | 345/87 |
| 5,457,342 | * 10/1995 | Herbst | 257/712 |
| 5,704,212 | * 1/1998 | Erler et al. | 62/3.2 |
| 5,890,371 | * 4/1999 | Rajasubramanian et al. | 62/259.2 |
| 5,934,079 | * 8/1999 | Han et al. | 62/3.2 |

FOREIGN PATENT DOCUMENTS

| | | |
|---|---|---|
| WO93/08600 | 4/1993 | (WO). |
| WO98/02695 | 1/1998 | (WO). |

OTHER PUBLICATIONS

Patent Abstracts of Japan, vol. 1996, No. 93, Sep. 30, 1996 & JP 08 130277 A (CALSONIC CORP.), May 21, 1996 abstract.

Patent Abstracts of Japan, vol. 1998, No. 3, Feb. 27, 1998 & JP 09 307034 A (NEC CORP.) Nov. 28, 1997 abstract.

* cited by examiner

*Primary Examiner*—William Doerrler
(74) *Attorney, Agent, or Firm*—Blakely, Sokoloff, Taylor & Zafman LPP

(57) ABSTRACT

A cooling unit for an integrated circuit. The cooling unit may include a peltier device that may be coupled to the integrated circuit and a plurality of fins that are thermally coupled to the peltier device. The fins may be separated by at least one channel. The cooling unit may include a fan that generates a flow of fluid through the channel.

19 Claims, 3 Drawing Sheets

COOLING UNIT FOR AN INTEGRATED CIRCUIT PACKAGE

BACKGROUND OF THE INVENTION

1. Field of the Invention

The present invention relates to a cooling unit for an integrated circuit package.

2. Background Information

Integrated circuits are typically assembled into packages that are soldered to a printed circuit board such as the motherboard of a computer system. The integrated circuit generates heat which must be removed to insure proper operation of the circuits embedded therein. The heat may flow from the package to a heat exchange surface in a conductive process and then removed from the surface by a flow of air generated by a fan of the computer system.

The temperature of the integrated circuit is proportional to the heat generated by the circuits and the thermal impedance between the circuit and the air flow. Newly developed integrated circuits typically generate more heat than their predecessors. It is desirable to provide an electronic assembly which has a lower thermal impedance than the prior art assembly to maintain, or if possible lower, the junction temperatures of the integrated circuit.

The fan requires power to generate the flow of air within the computer system. The power consumed by the fan may reduce the amount of operating time of the computer, particularly for battery power systems such as laptop computers. The fan typically operates at a speed that will remove a maximum amount of heat. The maximum fan speed is not required when the integrated circuit is producing less than maximum heat, for example, when in a power down mode.

There have been developed computer systems that vary the fan speed as a function of the system operating conditions to compensate for variations in the heat generated by the integrated circuit. Varying the fan speed only changes the convective heat transfer rate from the heat exchange surface to the airstream. It would be desirable to vary the conductive heat transfer rate from the package to the heat exchange surface. It would therefore be desirable to provide a cooling unit for an electronic package that can vary the conductive and convective heat transfer rates. It would also be desirable to provide an electronic package assembly that can effectively remove heat from an integrated circuit while minimizing the amount of power consumed by the system.

SUMMARY OF THE INVENTION

One embodiment of the present invention is a cooling unit for an integrated circuit. The cooling unit may include a peltier device that may be coupled to the integrated circuit and a plurality of fins that are thermally coupled to the peltier device. The fins may be separated by at least one channel. The cooling unit may include a fan that generates a flow of fluid through the channel.

DETAILED DESCRIPTION

Figure 1:
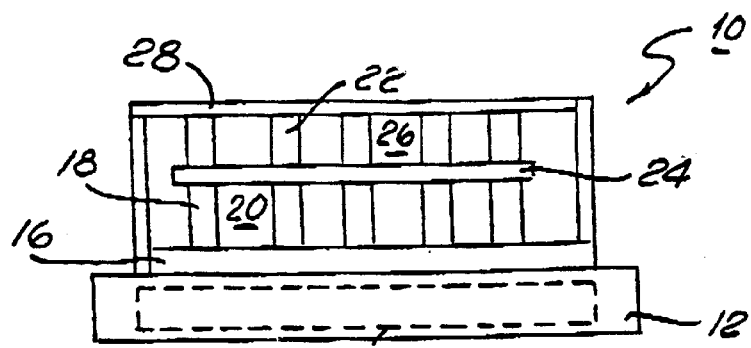
FIG. 1 is a front view of an embodiment of a cooling unit of the present invention.
Figure 2:
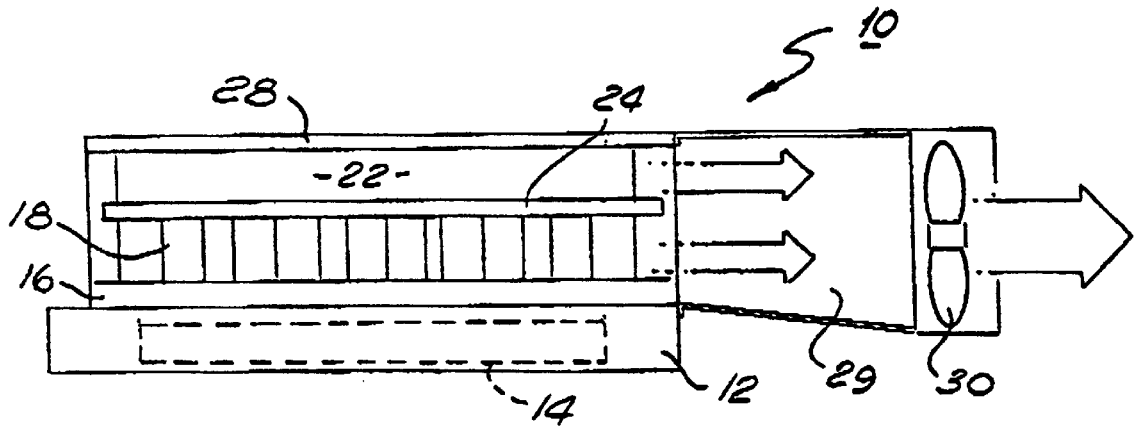
FIG. 2 is a side view of the cooling unit.

Referring to the drawings more particularly by reference numbers, FIGS. 1 and 2 show an embodiment of a cooling unit 10. The cooling unit 10 may cool a heat source such as an integrated circuit package 12. The integrated circuit package 12 may contain an integrated circuit 14 which generates heat. The cooling unit 10 removes the heat generated by the integrated circuit 14.

The cooling unit 10 may include a base plate 16 that is attached to the integrated circuit package 12. The base plate 16 may be constructed from a thermally conductive material such as copper or aluminum. The cooling unit 10 may further have a plurality of peltier devices 18 that are mounted to the base plate 16. The peltier devices 18 can remove heat in proportion to a current that is provided to the devices 18. The peltier device 18 can increase the conductive heat transfer rate from the package 12. The peltier devices 18 can be separated by channels 20.

The cooling unit 10 may have a plurality of conductive fins 22 that are attached to a plate 24 which is mounted to the peltier devices 18. The fins 22 and plate 24 may be constructed from a thermally conductive material such as copper or aluminum. Additionally, the fins 22 may be separated by a plurality of channels 26. The peltier devices 18 and fins 22 may be enclosed by an outer case 28. The case 28 may be constructed from a metal or plastic material. Heat generated by the integrated circuit 14 may conduct through the base plate 16 and into the peltier devices 18 and fins 22.

The channels 20 and 26 can be in fluid communication with a main duct 29 which contains a fan 30. The fan 30 can generate an air flow through the channels 20 and 26 which removes heat from the peltier devices 18 and the fins 22. When operating, the peltier devices 18 provide an active conductive means for removing heat from the integrated circuit 14. The fan 30 provides an active convective means for removing heat from the integrated circuit 14. The cooling unit 10 of the present invention thus provides two active means for removing heat from the integrated circuit.

Figure 3:
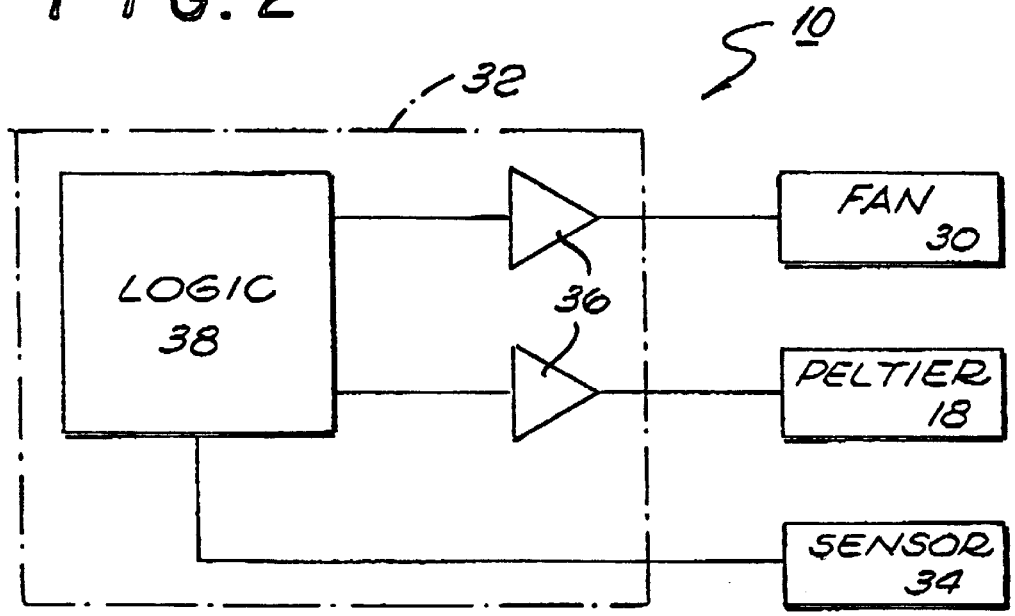
FIG. 3 is a schematic of a control system for the cooling unit.

As shown in FIG. 3 the cooling unit 10 may have a control circuit(s) 32 that controls the operation of the peltier devices 18 and the fan 30. The control circuit 32 may be connected to a temperature sensor 34. The temperature sensor 34 may be located within the cooling unit 10 or the integrated circuit package 12. Alternatively, the sensor 34 may be integrated within the integrated circuit 14. The control circuit 32 may include driver circuits 36 which provide power to the peltier devices 18 and the fan 30. The driver circuits 36 may be connected to a logic circuit 38. The logic circuit 38 may also be connected to the temperature sensor 34.

The logic circuit 38 may operate the cooling unit 10 in one of three modes depending upon the temperature detected by the sensor 34. If the temperature is below a first threshold $T_1$ the cooling unit 10 may operate in a first mode wherein both the fan 30 and peltier devices 18 are in an off state. This is a passive mode wherein the heat is transferred from the integrated circuit 14 by conduction and natural convection. If the temperature is greater than the first threshold $T_1$ but less than a second threshold $T_2$ the cooling unit 10 may operate in second mode wherein the logic circuit 38 switches the fan 30 to an on state. The cooling unit 10 may operate in a third mode if the temperature exceeds the second threshold $T_2$. In the third mode the logic circuit 38 switches the peltier devices 18 to an on state so that both the devices 18 and the fan 30 are active. The logic circuit 38 may also vary the amount of power provided to the peltier devices 18 and the fan 30 as a function of temperature to vary the fan speed and the heat transfer rate of the devices 18. For example, the fan speed can be increased with a rise in the temperature.

The present invention provides a cooling unit 10 that can increase the heat transfer rate from the integrated circuit 14 with an increase in the temperature and corresponding heat generated by the circuit. The unit 10 can increase the heat transfer rate in different modes so that power is not wasted removing heat. This improves the efficiency of the system. For example, when the integrated circuit 14 is in a "power down" state, the cooling unit 10 may operate in the passive mode, which may be sufficient to remove the heat generated by the circuit. The system does not unnecessarily operate the fan or power the peltier devices in this mode. Conversely, when the integrated circuit 14 is generating a maximum amount of heat the cooling unit can power both the fan 30 and the peltier devices 18 to remove the heat. In this mode, the cooling unit increases both the conductive and convective heat transfer rates by activating the peltier devices 18 and fan 30, respectively.

Figure 4:
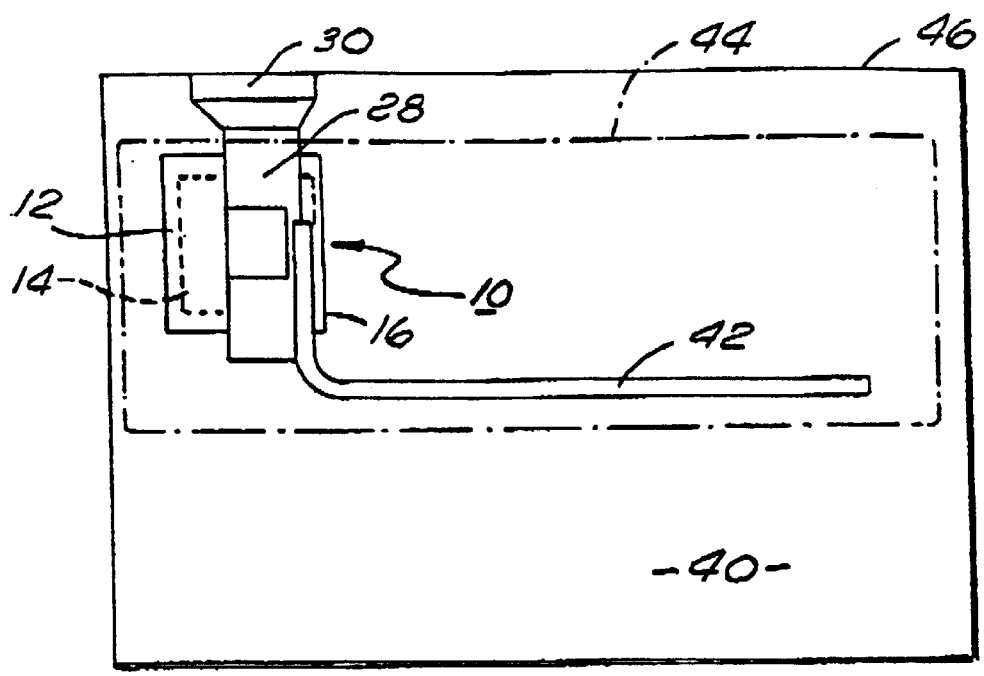
FIG. 4 is a top view showing the cooling unit within a computer.

FIG. 4 shows the cooling unit 10 incorporated into a computer system 40. The cooling unit 10 may further have a heat pipe 42 that extends from the base plate 16. The heat pipe 42 may extend along a heat spreader 44 incorporated into a housing 46 of the computer 40. The heat pipe 42 and heat spreader 44 provide another thermal path for the heat generated by the integrated circuit 14. By way of example, the system 40 may be a laptop computer that may be powered by a battery (not shown). The multiple modes of the cooling unit 10 provide a power conservation feature which assist in prolonging the life of the battery.

Figure 5:
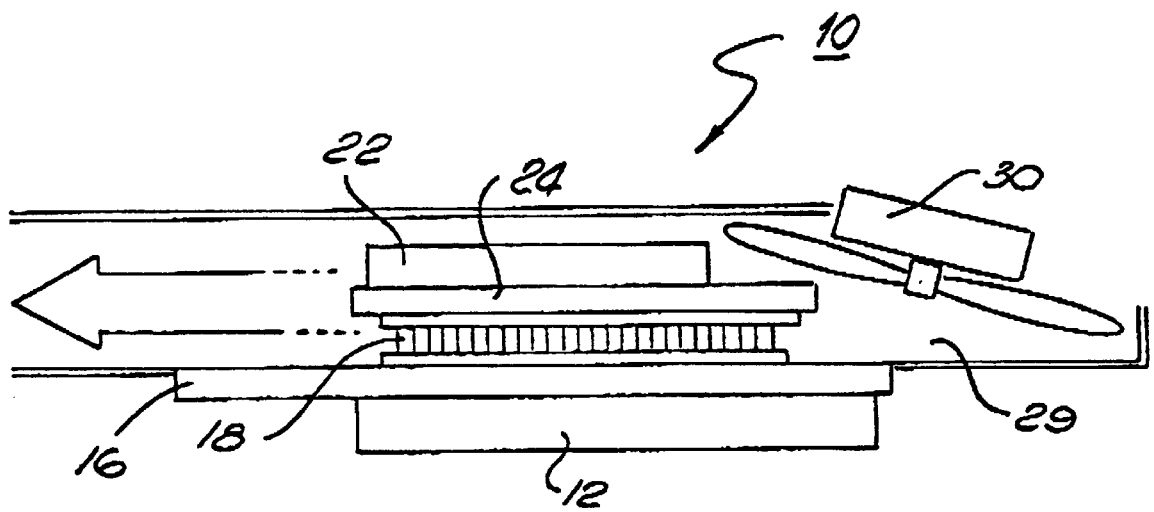
FIG. 5 is a side view showing an alternate embodiment of the cooling unit.

FIG. 5 shows an alternate embodiment of a cooling unit 10 wherein the fan 30 is oriented at an angle relative to the main duct 29. The angled fan 30 may reduce the height profile of the unit 10.

Figure 6:
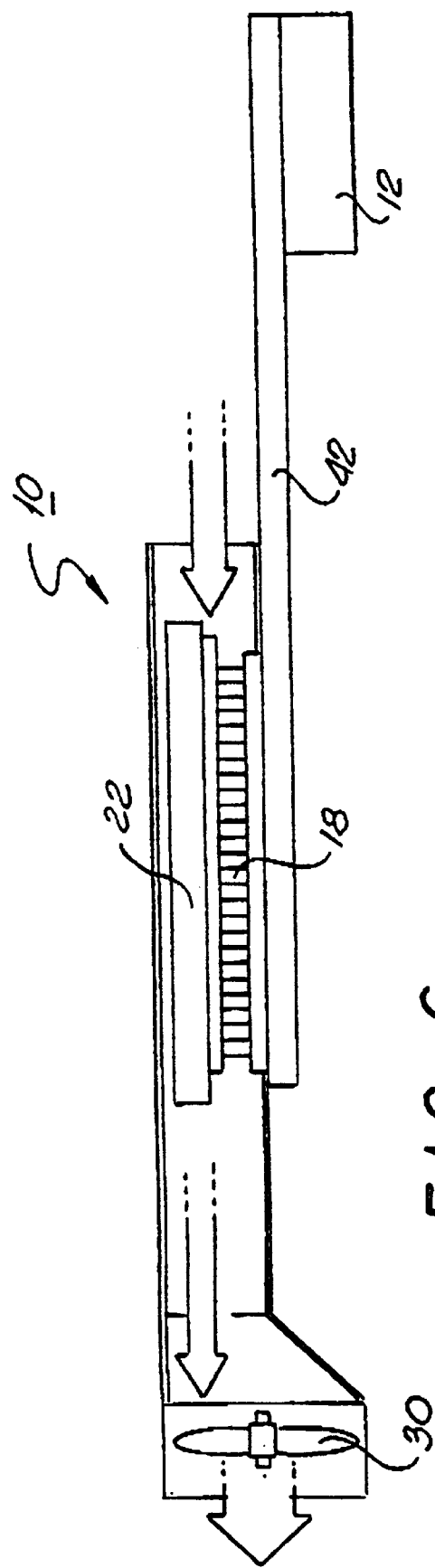
FIG. 6 is a side view showing an alternate embodiment of the cooling unit.

FIG. 6 shows an alternate embodiment of a cooling unit 10 wherein the heat pipe 42 provides a thermal medium to transfer heat from the integrated circuit package 12 to the peltier devices 18 and fins 22. Such a configuration may be desirable when the devices 18 and fins 22 cannot be assembled adjacent to the package 12.

Figure 7:
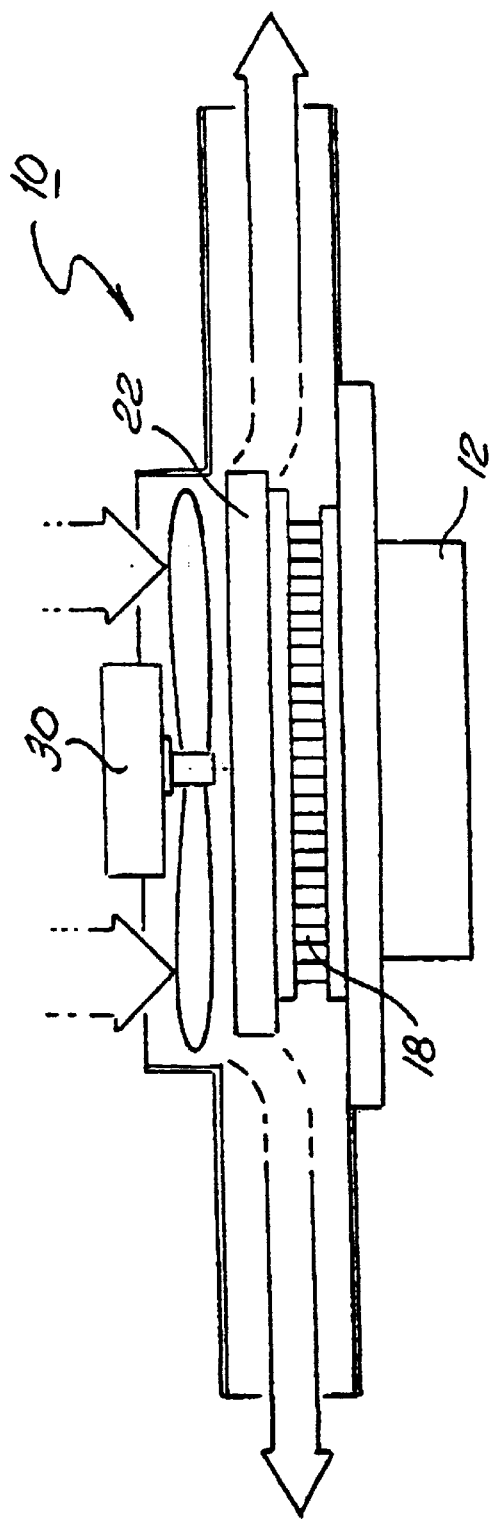
FIG. 7 is a side view showing an alternate embodiment of the cooling unit.

FIG. 7 shows another alternate embodiment of a cooling unit 10 wherein the fan 30 directs air in a direction that is perpendicular to the longitudinal axis of the fins 22. Such a configuration may reduce the length of the cooling unit 10.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A cooling unit for an integrated circuit, comprising:

a peltier device that is thermally coupled to the integrated circuit;

a first channel adjacent to said peltier device;

a plurality of fins that are thermally coupled to said peltier device and which are separated by a second channel; and, a fan that can generate a flow of fluid through said first channel adjacent to said peltier device is thermally coupled to the integrated circuit.

2. The cooling unit of claim 1, further comprising a base plate that is thermally coupled to said peltier device.

3. The cooling unit of claim 1, further comprising a heat pipe that is thermally coupled to the integrated circuit.

4. The cooling unit of claim 2, further comprising a heat pipe that is thermally coupled to said base plate.

5. The cooling unit of claim 1, wherein said fan introduces the flow of fluid in a direction that is essentially perpendicular to a longitudinal axis of said fin.

6. The cooling unit of claim 1, wherein said channel is in fluid communication with a main duct and said fan is oriented at an angle within said main duct.

7. The cooling unit of claim 1, further comprising a control circuit that is connected to said peltier device and said fan.

8. The cooling unit of claim 7, further comprising a temperature sensor that is connected to said control circuit and which senses a temperature.

9. The cooling unit of claim 8, wherein said control circuit can switch said peltier device and said fan between an on state and an off state, said control circuit operates said peltier device and said fan in the off state when the temperature is below a first threshold, operates said fan in the on state when the temperature is no less than the first threshold, and operates said fan and said peltier device in the on state when the temperature is no less than a second threshold.

10. An integrated circuit package assembly, comprising:

an integrated circuit;

a peltier device that is thermally coupled to said integrated circuit package;

a first channel adjacent to said peltier device;

a plurality of fins that are thermally coupled to said peltier device and which are separated by a second channel; and, a fan that can generate a flow of fluid through said first channel adjacent to said peltier device that is thermally coupled to said integrated circuit package.

11. The assembly of claim 10, further comprising a base plate that is thermally coupled to said peltier device and said integrated circuit.

12. The assembly of claim 10, further comprising a heat pipe that can be thermally coupled to said integrated circuit.

13. The assembly of claim 11, further comprising a heat pipe that is thermally coupled to said base plate.

14. The assembly of claim 10, wherein said fan introduces the flow of fluid in a direction that is essentially perpendicular to a longitudinal axis of said fin.

15. The cooling unit of claim 10, wherein said channel is in fluid communication with a main duct and said fan is oriented at an angle within said main duct.

16. The assembly of claim 10, further comprising a control circuit that is connected to said peltier device and said fan.

17. The assembly of claim 16, further comprising a temperature sensor that is connected to said control circuit and senses a temperature.

18. The assembly of claim 17, wherein said control circuit can switch said peltier device and said fan between an on state and an off state, said control circuit operates said peltier device and said fan in the off state when the first temperature is below a first threshold, operates said fan in the on state when the temperature is no less than the first threshold and operates said fan and said peltier device in the on state when the temperature is not less than a second threshold.

19. A method for cooling an integrated circuit, comprising:

sensing a temperature;

placing a peltier device that is thermally coupled to said integrated circuit and a fan in an off state if the temperature is below a first threshold;

generating a flow of fluid adjacent to the peltier device that is thermally coupled to said integrated circuit if the temperature is not less than the first threshold;

generating said flow of fluid and operating the peltier device in an on state if the temperature is not less than a second threshold.

* * * * *

UNITED STATES PATENT AND TRADEMARK OFFICE
CERTIFICATE OF CORRECTION

PATENT NO. : 6,173,576 B1
DATED : January 16, 2001
INVENTOR(S) : Ishida et al.

It is certified that error appears in the above-identified patent and that said Letters Patent is hereby corrected as shown below:

Title page,
Item [56], References Cited, Other Publications, please delete "vol. 1996, No. 93" and insert -- vol. 1996, No. 9 --.

Claim 1,
Line 2, please delete "is" and insert -- can be --.
Line 6, after 'a second channel', please insert -- on the opposite side of the peltier from the first channel --.
Line 9, please delete "device is" and insert -- device that is --.

Claim 10,
Line 7, after 'a second channel', please insert -- on the opposite side of the peltier from the first channel --.

Signed and Sealed this

Sixth Day of November, 2001

*Attest:*

NICHOLAS P. GODICI
*Attesting Officer*        Acting Director of the United States Patent and Trademark Office